US011137442B2

(12) United States Patent
Lee et al.

(10) Patent No.: US 11,137,442 B2
(45) Date of Patent: Oct. 5, 2021

(54) STIFFENER AND PROBE CARD INCLUDING THE SAME

(71) Applicant: SAMSUNG ELECTRONICS CO., LTD., Suwon-si (KR)

(72) Inventors: Sang-Ik Lee, Hwaseong-si (KR); Sung-Yong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 90 days.

(21) Appl. No.: 16/535,433

(22) Filed: Aug. 8, 2019

(65) Prior Publication Data

US 2020/0256916 A1 Aug. 13, 2020

(30) Foreign Application Priority Data

Feb. 11, 2019 (KR) .................. 10-2019-0015357

(51) Int. Cl.
*G01R 31/28* (2006.01)
*G01R 1/073* (2006.01)

(52) U.S. Cl.
CPC ..... *G01R 31/2887* (2013.01); *G01R 1/07307* (2013.01); *G01R 31/2818* (2013.01)

(58) Field of Classification Search
CPC ............ G01R 1/06705; G01R 1/06788; G01R 1/07307; G01R 31/2867; G01R 31/2893
See application file for complete search history.

(56) References Cited

U.S. PATENT DOCUMENTS

| 8,508,247 | B2 | 8/2013 | Hoshi et al. | |
| 8,525,538 | B2 | 9/2013 | Kim et al. | |
| 9,128,122 | B2 | 9/2015 | Andberg | |
| 2008/0174326 | A1* | 7/2008 | Jeon .................. | G01R 1/07342 324/754.07 |
| 2008/0297184 | A1* | 12/2008 | Miura ................ | G01R 1/07364 324/762.05 |
| 2008/0303540 | A1* | 12/2008 | Stiefvater .......... | G01R 1/07342 324/754.07 |
| 2017/0248632 | A1 | 8/2017 | Thompson et al. | |

FOREIGN PATENT DOCUMENTS

| JP | 2010-050437 | 3/2010 |
| KR | 10-2013-0130527 | 12/2013 |
| KR | 10-1766265 | 8/2017 |
| KR | 10-2018-0057351 | 5/2018 |

* cited by examiner

*Primary Examiner* — Tung X Nguyen
(74) *Attorney, Agent, or Firm* — F. Chau & Associates, LLC

(57) ABSTRACT

A stiffener of a probe card includes: a body plate arranged between a test head and a printed circuit board (PCB) of the probe card, wherein the test head is configured to apply a test signal to an object, and the PCB is configured to receive the test signal; a plurality of ribs radially extending from the body plate; an inner rim configured to surround the body plate to connect middle portions of the ribs with each other; and a plurality of contact members arranged on upper surfaces of at least two ribs among the ribs, and configured to make contact with the test head.

21 Claims, 8 Drawing Sheets

STIFFENER AND PROBE CARD INCLUDING THE SAME

CROSS-REFERENCE TO RELATED APPLICATION

This application claims priority under 35 U.S.C. § 119 to Korean Patent Application No. 10-2019-0015357, filed on Feb. 11, 2019 in the Korean Intellectual Property Office (KIPO), the disclosure of which is incorporated by reference herein in its entirety.

TECHNICAL FIELD

Exemplary embodiments of the present inventive concept relate to a stiffener and a probe card including the same. More particularly, Exemplary embodiments of the present inventive concept relate to a stiffener configured to support a probe card, and a probe card including the stiffener.

DISCUSSION OF THE RELATED ART

Generally, a probe card may be used for testing electrical characteristics of semiconductor chips on a semiconductor substrate. The probe card may include a printed circuit board (PCB), a stiffener, a multi-layered substrate and needles. The PCB may transmit a test signal generated from a test head to the multi-layered substrate. The needles arranged on the multi-layered substrate may make contact with terminals of each of the semiconductor chips that are to be tested. The stiffener may be arranged between the test head and the PCB to support the probe card.

In addition, a chuck configured to hold the semiconductor substrate may be upwardly moved to so that the needles may come into contact with the terminals of the semiconductor chip. An upward force of the chuck may be transferred to the PCB through the multi-layered substrate. However, a space may be formed between the stiffener and the test head so that the stiffener may not firmly support the PCB to which the upward force may be applied. Thus, the probe card may be bent due to the upward force, and when the probe card is bent, layers of the multi-layered substrate may be peeled. The peeled multi-layered substrate may cause a contact failure between the needles and the terminals of the semiconductor chip.

SUMMARY

According to an exemplary embodiment of the present inventive concept, a stiffener of a probe card includes: a body plate arranged between a test head and a printed circuit board (PCB) of the probe card, wherein the test head is configured to apply a test signal to an object, and the PCB is configured to receive the test signal; a plurality of ribs radially extending from the body plate; an inner rim configured to surround the body plate to connect middle portions of the ribs with each other; and a plurality of contact members arranged on upper surfaces of at least two ribs among the ribs, and configured to make contact with the test head.

According to an exemplary embodiment of the present inventive concept, a probe card includes: a printed circuit board (PCB) including a test pattern, wherein a test signal of a test head flows through the test pattern and is applied to an object; a stiffener disposed between the test head and the PCB; a plurality of contact members disposed between the stiffener and the test head to contact the stiffener and the test head; a multi-layered substrate overlapping the PCB and electrically connected with the test pattern; and a plurality of needles arranged on a lower surface of the multi-layered substrate and configured to electrically contact the object.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be explained in detail with reference to the accompanying drawings.

Figure 1:
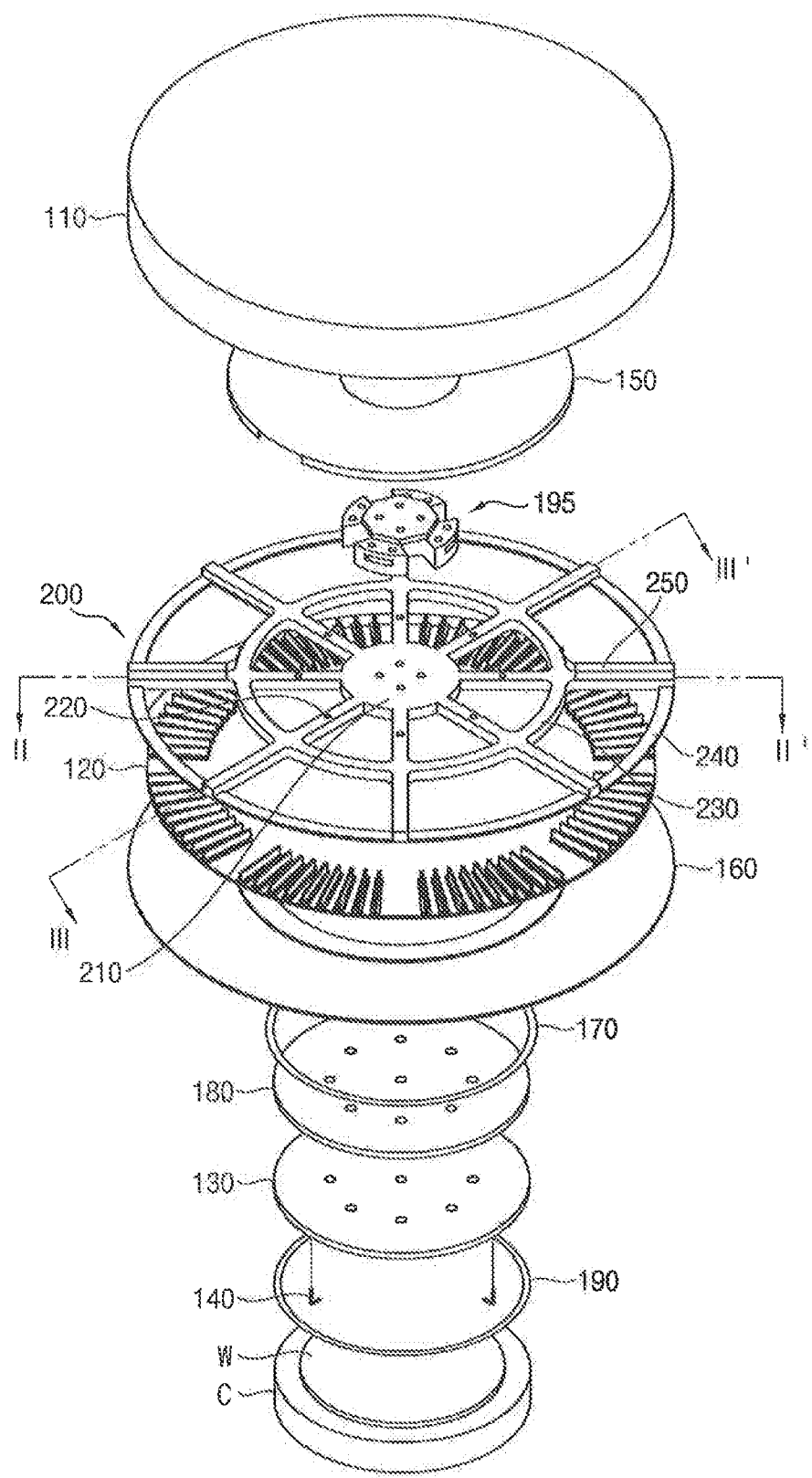
FIG. 1 is an exploded perspective view illustrating a probe card in accordance with an exemplary embodiment of the present inventive concept.
Figure 2:
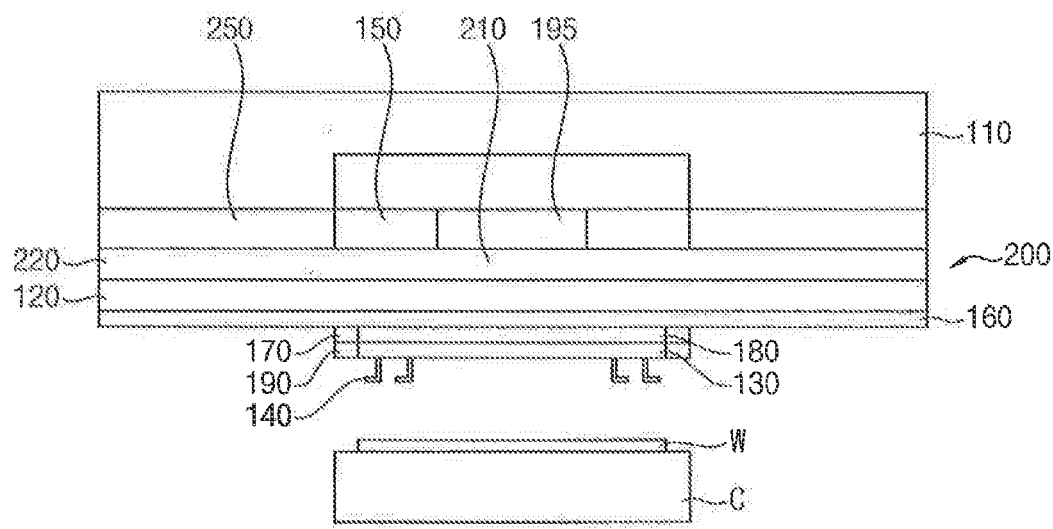
FIG. 2 is a cross-sectional view taken along a line II-II' in FIG. 1 in accordance with an exemplary embodiment of the present inventive concept.
Figure 3:
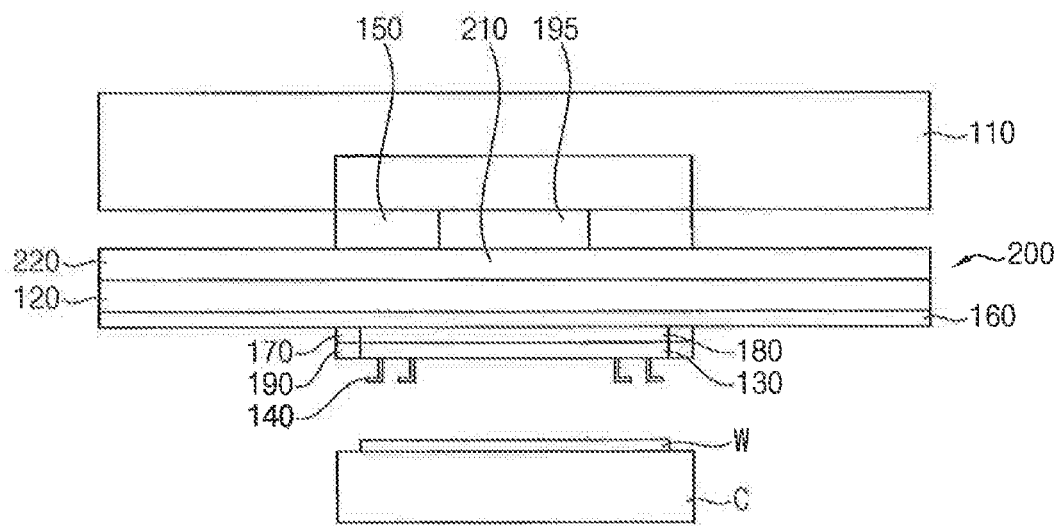
FIG. 3 is a cross-sectional view taken along a line III-III' in FIG. 1 in accordance with an exemplary embodiment of the present inventive concept.

FIG. 1 is an exploded perspective view illustrating a probe card in accordance with an exemplary embodiment of the present inventive concept, FIG. 2 is a cross-sectional view taken along a line II-II' in FIG. 1 in accordance with an exemplary embodiment of the present inventive concept, and FIG. 3 is a cross-sectional view taken along a line III-III' in FIG. 1 in accordance with an exemplary embodiment of the present inventive concept.

Referring to FIGS. 1 to 3, a probe card according to an exemplary embodiment of the present inventive concept may include a PCB 120, a multi-layered substrate 130, a plurality of needles 140, an upper cover 150, a lower cover 160, an upper rim 170, a spacer 180, a lower rim 190, a clamper 195 and a stiffener 200.

The probe card may be arranged on a test head 110. For example, the probe card may be disposed under the test head 110. The probe card may be arranged over a chuck C configured to fixing an object. In an exemplary embodiment of the present inventive concept, the object may include a semiconductor substrate W including a plurality of semiconductor chips. A test signal of the test head 110 may be supplied to the semiconductor chips through the probe card. The damper 195 may fix the probe card to the test head 110.

The PCB 120 may be arranged between the test head 110 and the chuck C. The PCB 120 may include circuit patterns through which the test signal may flow. The damper 195 may fix the PCB 120 to the test head 110.

The multi-layered substrate 130 may be arranged between the PCB 120 and the chuck C. The multi-layered substrate 130 may include a plurality of insulation substrates and conductive patterns in the insulation substrates. The conductive patterns of the multi-layered substrate 130 may be electrically connected with the circuit patterns of the PCB 120.

A plurality of interposers may be arranged between the PCB 120 and the multi-layered substrate 130. Each of the interposers may include pins configured to electrically connect the circuit patterns of the PCB 120 with the conductive patterns of the multi-layered substrate 130.

The upper rim 170 may be arranged between the PCB 120 and the multi-layered substrate 130. The upper rim 170 may be configured to surround the interposers between the PCB 120 and the multi-layered substrate 130, and the pins of the interposers may be protected.

The spacer 180 may be arranged between the interposers and the multi-layered substrate 130. The spacer 180 may function as to maintain a gap between the interposers and the multi-layered substrate 130. The spacer 180 may have a plurality of holes through which the pins of the interposers may pass. Thus, the pins of the interposers may be electrically connected with the conductive patterns of the multi-layered substrate 130 by extending through the holes of the spacer 180.

The needles 140 may be arranged on a lower surface of the multi-layered substrate 130. The needles 140 may be electrically connected with the conductive patterns of the multi-layered substrate 130. The needles 140 may electrically contact terminals of the semiconductor chips in the semiconductor substrate W on the chuck C. For example, the needles 140 may electrically connect the conductive patterns of the multi-layered substrate 130 to the terminals of the semiconductor chips.

The lower rim 190 may be arranged on the multi-layered substrate 130. For example, the lower rim 190 may be disposed on a side surface of the multi-layered substrate 130 or a lower surface of the multi-layered substrate 130. The lower rim 190 may be configured to surround the needles 140 to protect the needles 140.

The upper cover 150 may be configured to cover the stiffener 200. The upper cover 150 may have an opening configured to expose the damper 195 arranged at a central portion of the stiffener 200. For example, the opening of the upper cover 150 may be provided at a central portion of the upper cover 150.

The lower cover 160 may be configured to cover a lower surface of the PCB 120. The lower cover 160 may have an opening configured to expose the upper rim 170, the spacer 180, the multi-layered substrate 130 and the lower rim 190. For example, the opening of the lower cover 160 may be provided at a central portion thereof.

The stiffener 200 may be arranged between the test head 110 and the PCB 120. The stiffener 200 may include a body plate 210, a plurality of ribs 220, an inner rim 230, an outer rim 240 and a plurality of contact members 250.

The body plate 210 may correspond to a central portion of an upper surface of the PCB 120. For example, the body plate 210 may overlap the damper 195. The damper 195 may fix the body plate 210 to the central portion of the upper surface of the PCB 120. The body plate 210 may be spaced apart from a lower surface of the test head 110. For example, the body plate 210 may be spaced apart from a lower surface of a motherboard in the test head 110. The body plate 210 may have a circular plate shape. However, the present inventive concept is not limited thereto, and the body plate 210 may have, for example, a polygonal shape.

The ribs 220 may radially extend from the body plate 210. For example, the ribs 220 may be extended from an outer side surface of the body plate 210 in a radius direction of the body plate 210. The ribs 220 may be spaced apart from each other by a gap. For example, the gap between each of the ribs 220 may be substantially uniform. An upper surface of each of the ribs 220 may be spaced apart from the lower surface of the test head 110. In an exemplary embodiment of the present inventive concept, there may be eight ribs 220 extending from the body plate 210. Thus, the gap between the ribs 220 may be about 45° C. However, the number of the ribs 220 may not be limited to a specific number. For example, the number of the ribs 220 may be no more than 7 or no less than 9.

The inner rim 230 may be configured to surround the body plate 210. The inner rim 230 may have an annular shape or a circular shape including an opening. The inner rim 230 may be concentrically arranged around the body plate 210. The inner rim 230 may connect middles portions of the ribs 220 with each other. The inner rim 230 may be spaced apart from the lower surface of the test head 110.

The outer rim 240 may be configured to surround the inner rim 230. The outer rim 240 may have an annular shape (or, e.g., a circular shape including an opening) having a radius longer than that of the inner rim 230. The outer rim 240 may be concentrically arranged around the inner rim 230 and the body plate 210. The outer rim 240 may connect outer ends of the ribs 220 with each other. For example, the outer ends of the ribs 220 may be portions of the ribs 220 that are furthest from the body plate 210. The outer rim 240 may be spaced apart from the lower surface of the test head 110 and the inner rim 230.

Therefore, the stiffener 200 may be spaced apart from the lower surface of the test head 110 to form a space between the stiffener 200 and the test head 110. In addition, the needles 140 may make contact with the terminals of the semiconductor chip by upwardly moving the chuck C, and an upward force of the chuck C may be transferred to the PCB 120 through the needles 140 and the multi-layered substrate 130. When the space exists between the stiffener 200 and the test head 110, the stiffener 200 may not firmly support the PCB 120 that may be applied with the upward force of the chuck C. Thus, the probe card may be bent and the multi-layered substrate 130 may be peeled. The peeled multi-layered substrate 130 may cause a contact failure between the needles 140 and the terminals of the semiconductor chip.

To prevent the contact failure between the needles 140 and the terminals of the semiconductor chip, the contact members 250 may be arranged on the ribs 220. For example, the contact members 250 may be arranged on upper surfaces of the ribs 220. The contact members 250 may have a uniform height. Further, each of the contact members 250 may have an upper surface configured to make contact with the lower surface of the test head 110. Because the lower surface of the test head 110 may be flat, the upper surface of each of the contact member 250 may also be flat. Thus, the upper surfaces of the contact members 250 may make contact with the lower surface of the test head 110. For example, the contact members 250 may connect the ribs 220 of the stiffener 200 with the test head 110.

As a result, as shown in FIG. 2, the space may not be formed between the ribs 220 with the contact members 250 disposed thereon and the test head 110. In contrast, as shown in FIG. 3, the space may be formed between the ribs 220 without the contact members 250 and the test head 110.

In an exemplary embodiment of the present inventive concept, the contact members 250 may be two members arranged on the upper surfaces of two ribs 220. For example, the two contact members 250 may be arranged on the upper surfaces of the two ribs 220 arranged by a gap of about 180° therebetween. Thus, the two contact members 250 may also be arranged by a gap of about 180° therebetween. As a result, the two contact members 250 may be arranged on the upper surfaces of the two ribs 220 arranged by the gap of about 180° so that a force (e.g., a reaction three) transferred to the PCB 120 from the test head 110 through the two contact members 250 may be substantially uniform. Therefore, the PCB 120 and the multi-layered substrate 130 may not be peeled.

Further, each of the contact members 250 may be extended from an outer end of each of the two ribs 220 to the middle portion of each of the two ribs 220. The middle portions of the two ribs 220 may correspond to portions of the two ribs 220 connected to the inner rim 230. Each of the contact members 250 may have a width substantially the same as that of each of the ribs 220. In addition, the width of the contact members 250 may be wider or narrower than the width of the ribs 220.

In an exemplary embodiment of the present inventive concept, each of the contact members 250 may extend the full length of the ribs 220.

In an exemplary embodiment of the present inventive concept, the contact members 250 may be separated from the ribs 220. The contact members 250 may be fixed to the upper surfaces of the two ribs 220 using a fixing member such as a bolt or an adhesive. The contact members 250 may include a material substantially the same as that of the ribs 220. In addition, the material of the contact members 250 may be different from the material of the ribs 220.

Figure 4:
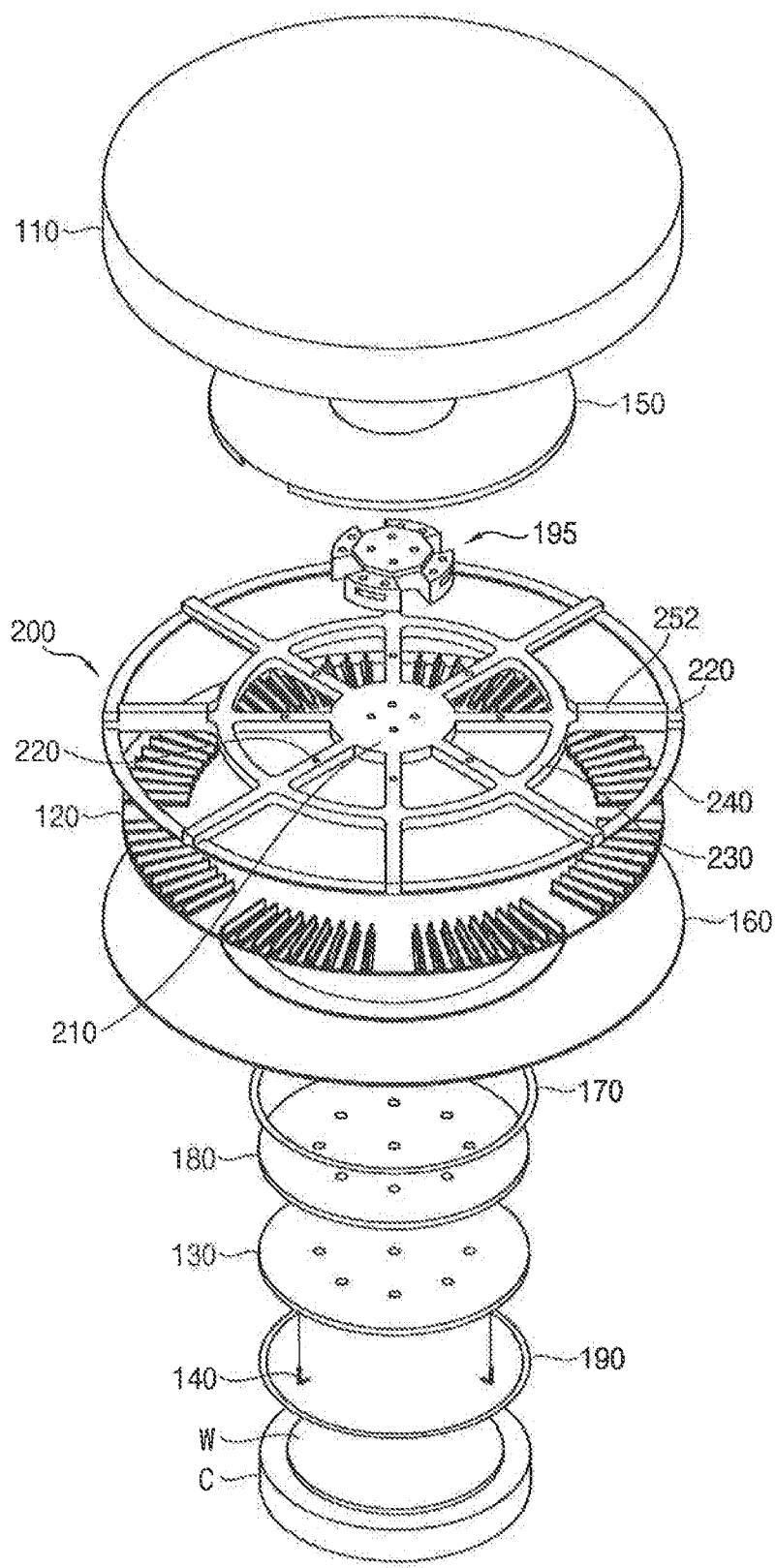
FIG. 4 is an exploded perspective view illustrating a probe card in accordance with an exemplary embodiment of the present inventive concept.
Figure 5:
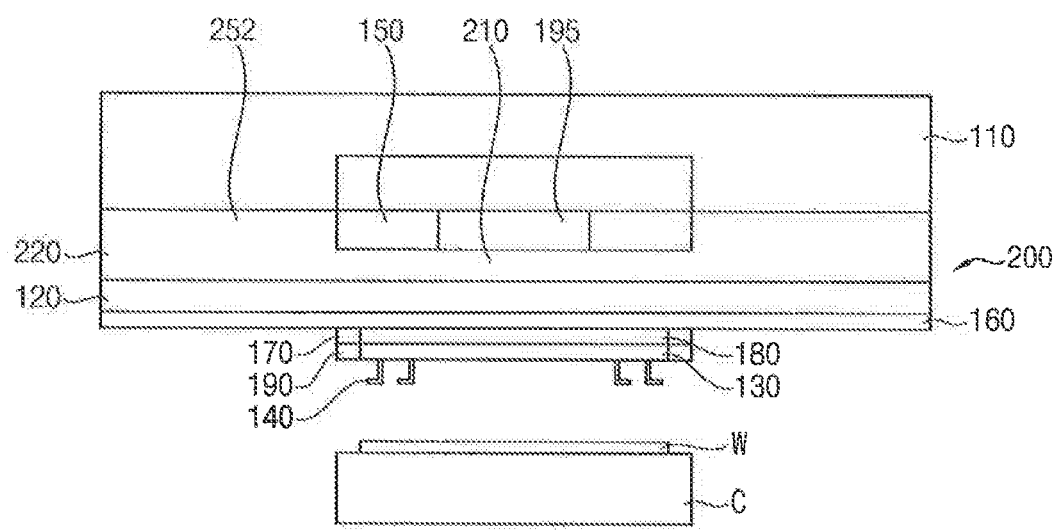
FIG. 5 is a cross-sectional view taken along a line V-V' in FIG. 4 in accordance with an exemplary embodiment of the present inventive concept.

FIG. 4 is an exploded perspective view illustrating a probe card in accordance with an exemplary embodiment of the present inventive concept, and FIG. 5 is a cross-sectional view taken along a line V-V' in FIG. 4 in accordance with an exemplary embodiment of the present inventive concept.

A probe card according to the present embodiment may include elements that may be substantially the same as those of the probe card in FIG. 1 except for contact members. Thus, like reference numerals may refer to like elements, and thus, repetitive descriptions, with respect to elements that are the same or substantially the same, may be omitted herein.

Referring to FIGS. 4 and 5, two contact members 252 according to the present embodiment may be formed integrally with the ribs 220. For example, the two contact members 252 may be formed on the ribs 220 by increasing a thickness of each of the ribs 220. For example, the contact members 252 and ribs 220 may be a single body. Thus, the contact members 252 may include a material substantially the same as that of the ribs 220.

The two contact members 252 may have a shape and an arrangement substantially the same as those of the contact members 250 in FIG. 1. Thus, any further description with respect to the shape and the arrangement of the contact members 252 may be omitted herein.

Figure 6:
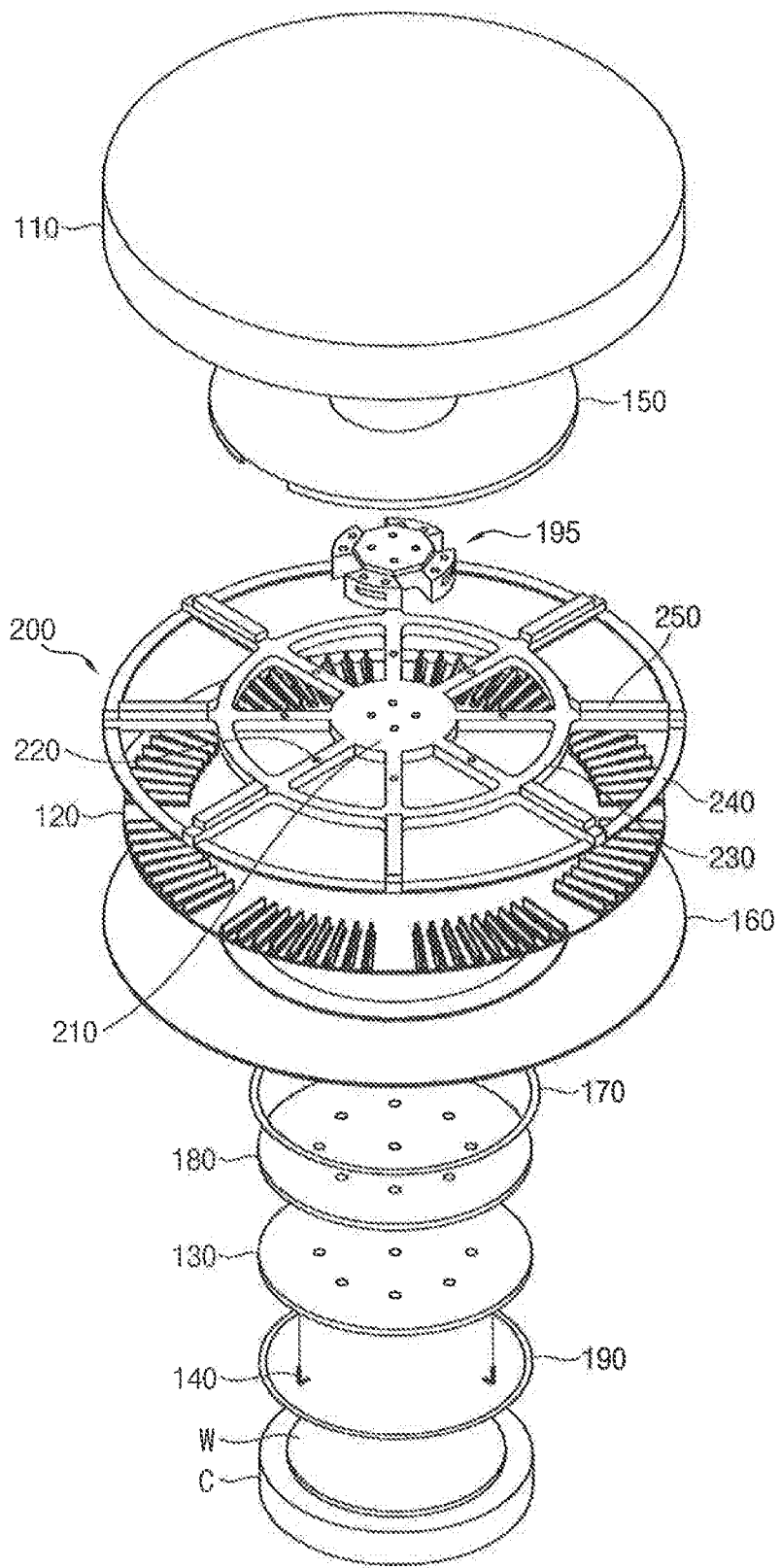
FIG. 6 is an exploded perspective view illustrating a probe card in accordance with an exemplary embodiment of the present inventive concept.
Figure 7:
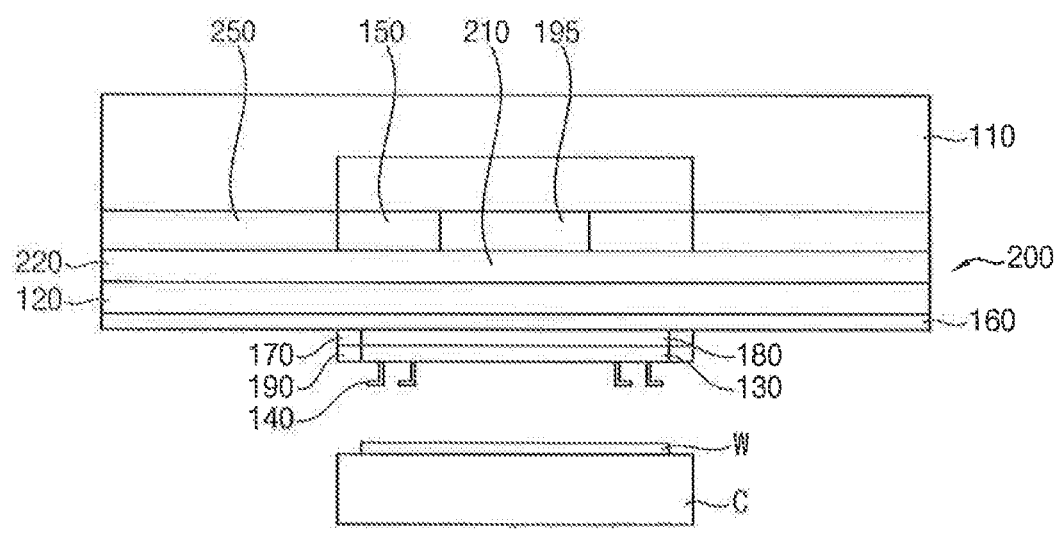
FIG. 7 is a cross-sectional view taken along a line VII-VII' in FIG. 6 in accordance with an exemplary embodiment of the present inventive concept.

FIG. 6 is an exploded perspective view illustrating a probe card in accordance with an exemplary embodiment of the present inventive concept, and FIG. 7 is a cross-sectional view taken along a line VII-VII' in FIG. 6 in accordance with an exemplary embodiment of the present inventive concept.

A probe card of according to the present embodiment may include elements that may be substantially the same as those of the probe card in FIG. 1 except for the number of contact members. Thus, like reference numerals may refer to like elements, and thus, repetitive descriptions, with respect to elements that are the same or substantially the same, may be omitted herein.

Referring to FIGS. 6 and 7, the contact members 250 according the present embodiment may be arranged on the upper surfaces of all of the ribs 220. Because the number of the ribs 220 may be eight, eight contact members 250 may be arranged on the upper surfaces of the eight ribs 220. In FIG. 6, eight contact members 250 and eight ribs 220 are illustrated; however, the present inventive concept is not limited thereto.

The eight contact members 250 may connect the stiffener 200 with the test head 110 so that peeling of the multi-layered substrate 130 may be more suppressed by using the eight contact members 250 compared to using the two contact members 250. In an exemplary embodiment of the present inventive concept, the eight contact members 250 may include a material substantially the same as that of the ribs 220. In addition, the material of the eight contact members 250 may be different from the material of the ribs 220.

Figure 8:
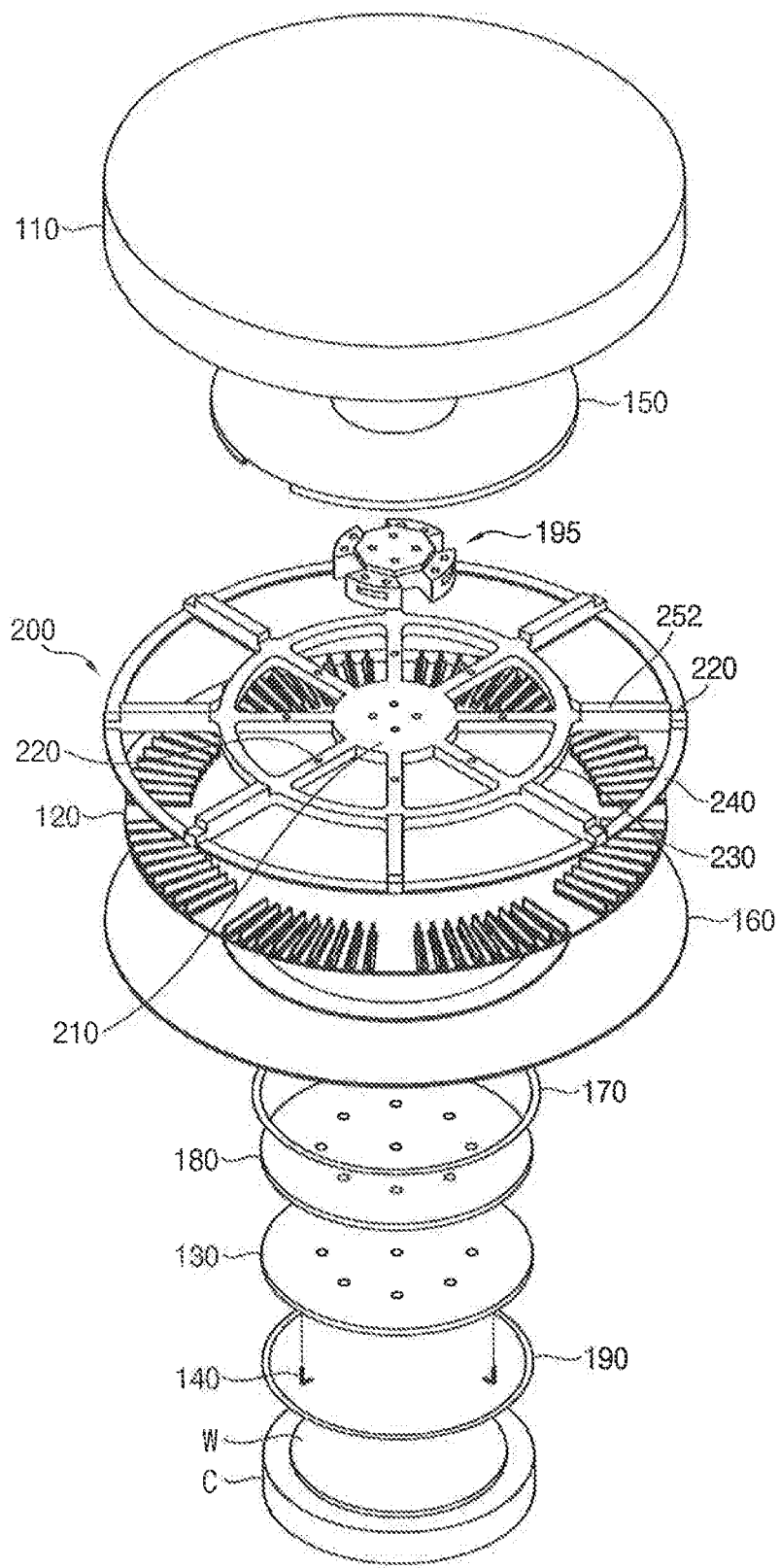
FIG. 8 is an exploded perspective view illustrating a probe card in accordance with an exemplary embodiment of the present inventive concept.
Figure 9:
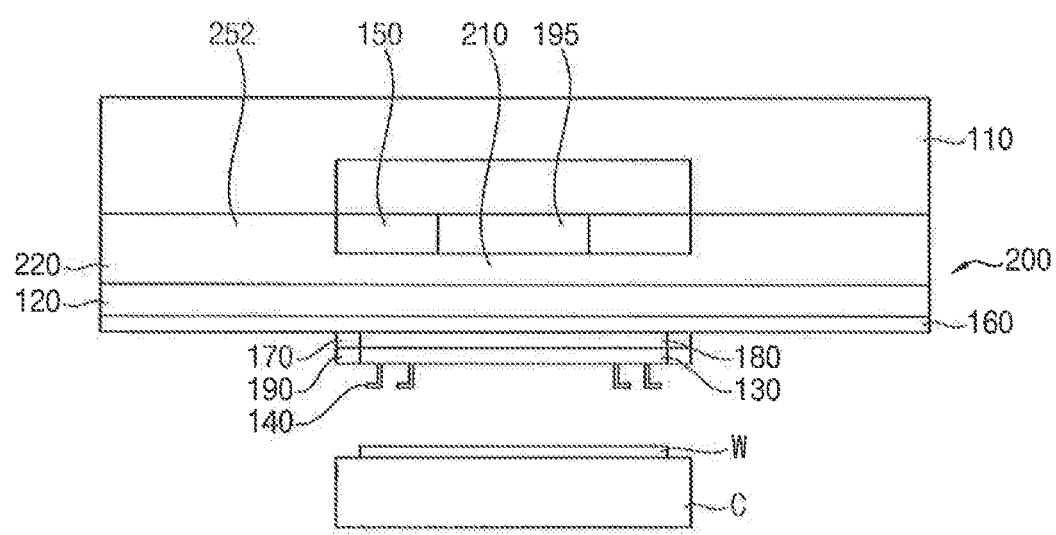
FIG. 9 is a cross-sectional view taken along a line IX-IX' in FIG. 8 in accordance with an exemplary embodiment of the present inventive concept.

FIG. 8 is an exploded perspective view illustrating a probe card in accordance with an exemplary embodiment of the present inventive concept, and FIG. 9 is a cross-sectional view taken along a line IX-IX' in FIG. 8 in accordance with an exemplary embodiment of the present inventive concept.

A probe card according to the present embodiment may include elements that may be substantially the same as those of the probe card in FIG. 4 except for contact members. Thus, like reference numerals may refer to like elements, and thus, repetitive descriptions, with respect to elements that are the same or substantially the same, may be omitted herein.

Referring to FIGS. 8 and 9, eight contact members 252 according to the present embodiment may be formed integrally with the ribs 220. For example, the contact members 252 may be formed on all of the ribs 220 by increasing a thickness of each of the ribs 220. For example, the increased thickness of each of the ribs 220 may form the contact members 252. Thus, the contact members 252 may include a material substantially the same as that of the ribs 220. In FIG. 8, eight contact members 252 and eight ribs 220 are illustrated; however, the present inventive concept is not limited thereto.

The eight contact members 252 may have a shape and an arrangement substantially the same as those of the contact members 252 in FIG. 4. Thus, any further descriptions with respect to the shape and the arrangement of the contact members 252 may be omitted herein.

In an exemplary embodiment of the present inventive concept, with reference to, e.g., FIGS. 2 and 6, the contact members 250 may be arranged on the stiffener 200. In addition, the contact members 250 may be arranged on the test head 110. For example, the contact members 250 may be separately arranged on the lower surface of the test head 110 or integrally formed with the lower surface of the test head 110.

According to an exemplary embodiment of the present inventive concept, the contact members may be arranged between the stiffener and the test head so that a space may not be formed between the stiffener and the test head to prevent peeling of the multi-layered substrate. Therefore, the stiffener may have a stiffness with respect to an upward force of a chuck, which may be configured to hold an object such as a semiconductor substrate, such that bending of the probe card and peeling of the multi-layered substrate may be prevented. As a result, contacts between the needles and the object may be increased and contact failure between the needles and the object may be prevented.

While the present inventive concept has been particularly shown and described with reference to exemplary embodiments thereof, it will be apparent to those of ordinary skill in the art that various changes in form and detail may be made thereto without departing from the spirit and scope of the present inventive concept as set forth in the following claims.

What is claimed is:

1. A stiffener of a probe card, the stiffener comprising:
    a body plate arranged between a test head and a printed circuit board (PCB) of the probe card, wherein the test head is configured to apply a test signal to an object, and the PCB is configured to receive the test signal;
    a plurality of ribs radially extending from the body plate;
    an inner rim configured to surround the body plate to connect middle portions of the ribs with each other; and
    a plurality of contact members arranged on upper, surfaces of at least two ribs among the ribs, and configured to make contact with the test head.

2. The stiffener of claim 1, wherein each of the contact members is arranged on a part of the upper surface of each of the ribs.

3. The stiffener of claim 2, wherein each of the contact members is extended from an outer end of each of the ribs to the middle portion of each of the ribs.

4. The stiffener of claim 1, wherein each of the contact members is integrally formed with at least two ribs among the ribs.

5. The stiffener of claim 1, wherein the contact members are spaced apart from each other by a gap.

6. The stiffener of claim 1, wherein the contact members are arranged on the upper surfaces of all of the ribs.

7. The stiffener of claim 1, wherein each of the contact members is integrally formed with each of the ribs.

8. The stiffener of claim 1, wherein the ribs are spaced apart from each other by a gap.

9. The stiffener of claim 1, further comprising an outer rim configured to connect outer ends of the ribs with each other.

10. A probe card comprising:
    a. printed circuit board (PCB) including a test pattern, wherein a test signal of a test head flows through the test pattern and is applied to an object;
    a stiffener disposed between the test head and the PCB;
    a plurality of contact members disposed between the stiffener and the test head to contact the stiffener and the test head;
    a multi-layered substrate overlapping the PCB and electrically connected with the test pattern; and
    a plurality of needles arranged on a lower surface of the multi-layered substrate and configured to electrically contact the object.

11. The probe card of claim 10, wherein the contact members are integrally formed with the stiffener.

12. The probe card of claim 11, wherein the stiffener comprises:
    a body plate arranged between the test head and the PCB;
    a plurality of ribs radially extending from the body plate, wherein the contact members are arranged on the ribs; and
    an inner rim configured to surround the body plate and to connect middle portions of the ribs with each other.

13. The probe card of claim 12, wherein the contact members are arranged on upper surfaces of at least two ribs among the ribs.

14. The probe card of claim 12, wherein the contact members are arranged on upper surfaces of all of the ribs.

15. The probe card of claim 12, wherein each of the contact members is arranged on a part of an upper surface of each of the ribs.

16. The probe card of claim 15, wherein each of the contact members is extended from an outer end of each of the ribs to the middle portion of each of the ribs.

17. The probe card of claim 12, wherein each of the contact members is integrally formed with at least two ribs among the ribs.

18. The probe card of claim 12, wherein the contact members are spaced apart from each other by a uniform gap.

19. The probe card of claim 12, wherein the ribs are spaced apart from each other by a uniform gap.

20. The probe card of claim 12, wherein the stiffener further comprises an outer rim configured to connect outer ends of the ribs with each other.

21. The stiffener of claim 1, wherein the plurality of contact members is disposed above the upper surfaces of the at least two ribs among the ribs.

* * * * *